(12) United States Patent
Ghantous et al.

(10) Patent No.: US 8,131,517 B2
(45) Date of Patent: Mar. 6, 2012

(54) INTERCONNECTED OBJECTS SLOPE MODIFICATION TOOL

(75) Inventors: Sami E. Ghantous, San Francisco, CA (US); Rebecca F. Richkus, Derry, NH (US); Thord Backe, Hopkinton, NH (US)

(73) Assignee: Autodesk, Inc., San Rafael, CA (US)

( * ) Notice: Subject to any disclaimer, the term of this patent is extended or adjusted under 35 U.S.C. 154(b) by 485 days.

(21) Appl. No.: 11/933,891

(22) Filed: Nov. 1, 2007

(65) Prior Publication Data

US 2009/0119071 A1 May 7, 2009

(51) Int. Cl.
*G06F 17/10* (2006.01)
(52) U.S. Cl. .......................................... 703/2
(58) Field of Classification Search ............... 703/1, 2
See application file for complete search history.

(56) References Cited

U.S. PATENT DOCUMENTS 5,740,341 A * 4/1998 Oota et al. ............. 345/420
6,662,144 B1 * 12/2003 Normann et al. ........... 703/1

* cited by examiner

*Primary Examiner* — Hugh Jones
(74) *Attorney, Agent, or Firm* — Gates & Cooper LLP

(57) ABSTRACT

A method, apparatus, and article of manufacture provide the ability to update a slope of a run in a system in a computer drawing application. A system run (i.e., an interconnected series of objects) is selected in a computer drawing application. The objects in the interconnected series are part of the same system and the series has a starting point and an ending point. A property for a slope of the system run is specified. The slope of the system run is updated across all of the interconnected series of objects based on the specified property.

27 Claims, 7 Drawing Sheets

INTERCONNECTED OBJECTS SLOPE MODIFICATION TOOL

BACKGROUND OF THE INVENTION

1. Field of the Invention

The present invention relates generally to piping and plumbing computer aided design systems, and in particular, to a method, apparatus, and article of manufacture for modifying a slope for interconnected plumbing/piping objects.

2. Description of the Related Art

Computer drafting and computer-aided design (CAD) applications are often used during the design and construction process to assist in designing building solutions. For example, such an application may be utilized to design piping and plumbing systems within a project. Certain types of piping and plumbing systems require that the piping has a "slope" applied to it. With the advent of three-dimensional (3D) modeling systems with interconnected objects, applying slope to a run of piping requires complex algorithms and assumptions in order to attempt to properly update the slope when making modifications to the model.

When making models of sloped piping systems after many iterations of modifications, the model may become disconnected or may not result in what the user wanted because the slope of other interconnected pipes may have caused the pipe run in question to move in an undesired way. As a result, the user's confidence in the model of the sloped pipe is reduced and the user won't find value in modeling the sloped pipe and resort to using older drafting methods to account for the slope and include that information on their drawings.

Such disadvantages may be better understood with a description of prior art systems that provide for elevation and slope determinations.

As described above, CAD application programs are used for generic design or specialized systems such as architecture, engineering, and construction (AEC) systems. For example, a CAD application program may be used in the creation and modification of an HVAC (heating, ventilation, and air conditioning) system, a plumbing and piping system, an electrical system, cable tray, conduit, a communications network, etc. Such systems may be further broken down into one or more subsystems. A subsystem is any fully connected set of components that share the common function of carrying the same fluid. For example, an HVAC system might include a gas pipe, hydronic pipe, and air duct subsystems. Key components link to more than one subsystem and serve the function of transferring energy from one subsystem to the next. For example, cold water might be used to cool air.

To accommodate the different types of systems and subsystems, 2D and/or 3D piping design systems provide the ability to draw a series of lines/pipes that represent a system/subsystem. Thereafter, the user may desire to modify or establish an appropriate slope for various segments of a system (e.g., a piping system). For example, when designing plumbing/piping lines, a slope may be needed for the appropriate directional flow of liquid or other materials through the piping. Such a slope establishes a defined slant angle that the designer desires across a piping run that may consist of multiple pipe objects/segments.

To define the slope, the user selects/identifies a particular object (e.g., a pipe object) and defines/modifies the slope for the object. However, if the object is connected to other objects, the other objects will not adjust their slope based on the modification. Alternatively, the other objects may adjust but in an unpredictable/undesirable manner. Accordingly, to change a slope in the prior art, the user was required to manually change the elevation at one point, manually determine how far the distance/length of the run (e.g., a pipe run) was, calculate the elevation at the end of the run, and manually change the elevation at that point. In this regard, the user was often required to manually adjust each individual object in a run to configure the slope in the desired manner.

FIG. 1 illustrates a prior art dialog box utilized to configure the elevation of a pipe object. To display dialog box 100, the user selects a plumbing line, and activates a menu choice displayed pursuant to the use of the right mouse button. The user may then enter a different value for the elevation in field 102 and selects/clicks the "OK" button. However, as described above, such a change to a plumbing line may break the connection of the selected plumbing line with other components. To resolve such breaks, the user may be required to reconnect disconnected components in a run by adding connecting segments, changing the elevation of the other segments, or moving or stretching the components. In addition, prior art implementations may not provide the ability to alter the slope but instead may merely add a riser at an identified point. Such a riser would merely increase the elevation at the identified point and break the pipe from any previously connected components.

In view of the above, what is needed is a tool that enables a user to modify the slope of a selected pipe run including all components within the pipe run.

SUMMARY OF THE INVENTION

One or more embodiments of the invention provide a slope modification tool that allows the user to specify a run of a system (e.g., a piping run) to which the user desires to apply the slope. The tool further provides that all of the interconnected objects in the specified run will update themselves secondary to the run that the user selected.

Embodiments provide the user with an interface to correct the slope of a run thereby regaining the user's confidence in the model being creating and ensuring that the model is accurate. The tool further saves the user time from having to either redraw the run or make tedious manual modifications to specific objects in the network.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention provide a tool that allows the user to identify the start and end of a system run, the desired slope across such a run, and the ability to automatically update all of the segments of the system run based on the user-defined settings.

Hardware Environment

Figure 1:
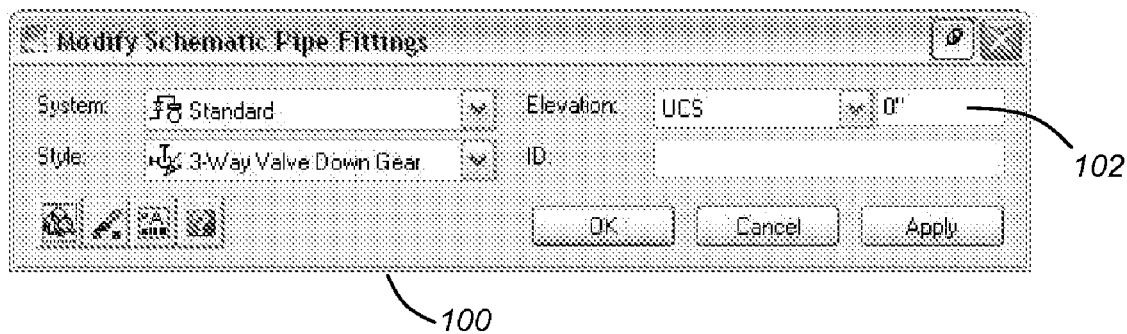
FIG. 1 illustrates a prior art dialog box utilized to configure the elevation of a pipe object.
Figure 2:
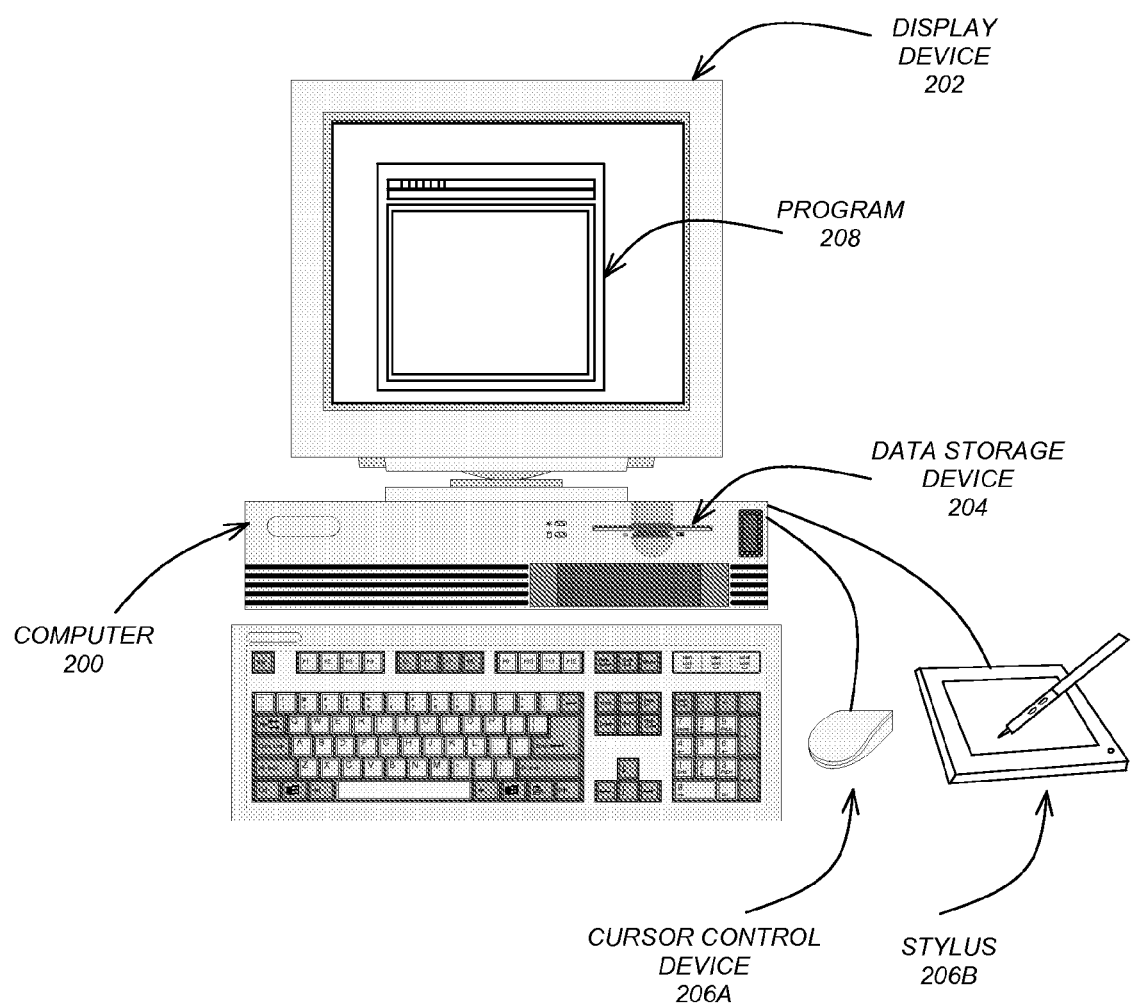
FIG. 2 is an exemplary hardware and software environment used to implement one or more embodiments of the invention.

FIG. 2 is an exemplary hardware and software environment used to implement one or more embodiments of the invention. Embodiments of the invention are typically implemented using a computer 200, which generally includes, inter alia, a display device 202, data storage device(s) 204, cursor control devices 206A, stylus 206B, and other devices. Those skilled in the art will recognize that any combination of the above components, or any number of different components, peripherals, and other devices, may be used with the computer 200.

One or more embodiments of the invention are implemented by a computer-implemented program 208. Such a program may be a media player, a video editing program, an effects program, compositing application, or any type of program that executes on a computer 200. The program 208 may be represented by a window displayed on the display device 202. Generally, the program 208 comprises logic and/or data embodied in/or readable from a device and/or media, e.g., one or more fixed and/or removable data storage devices 204 connected directly or indirectly to the computer 200, one or more remote devices coupled to the computer 200 via a data communications device, etc. In addition, program 208 (or other programs described herein) may be an object-oriented program having objects and methods as understood in the art.

Figure 3:
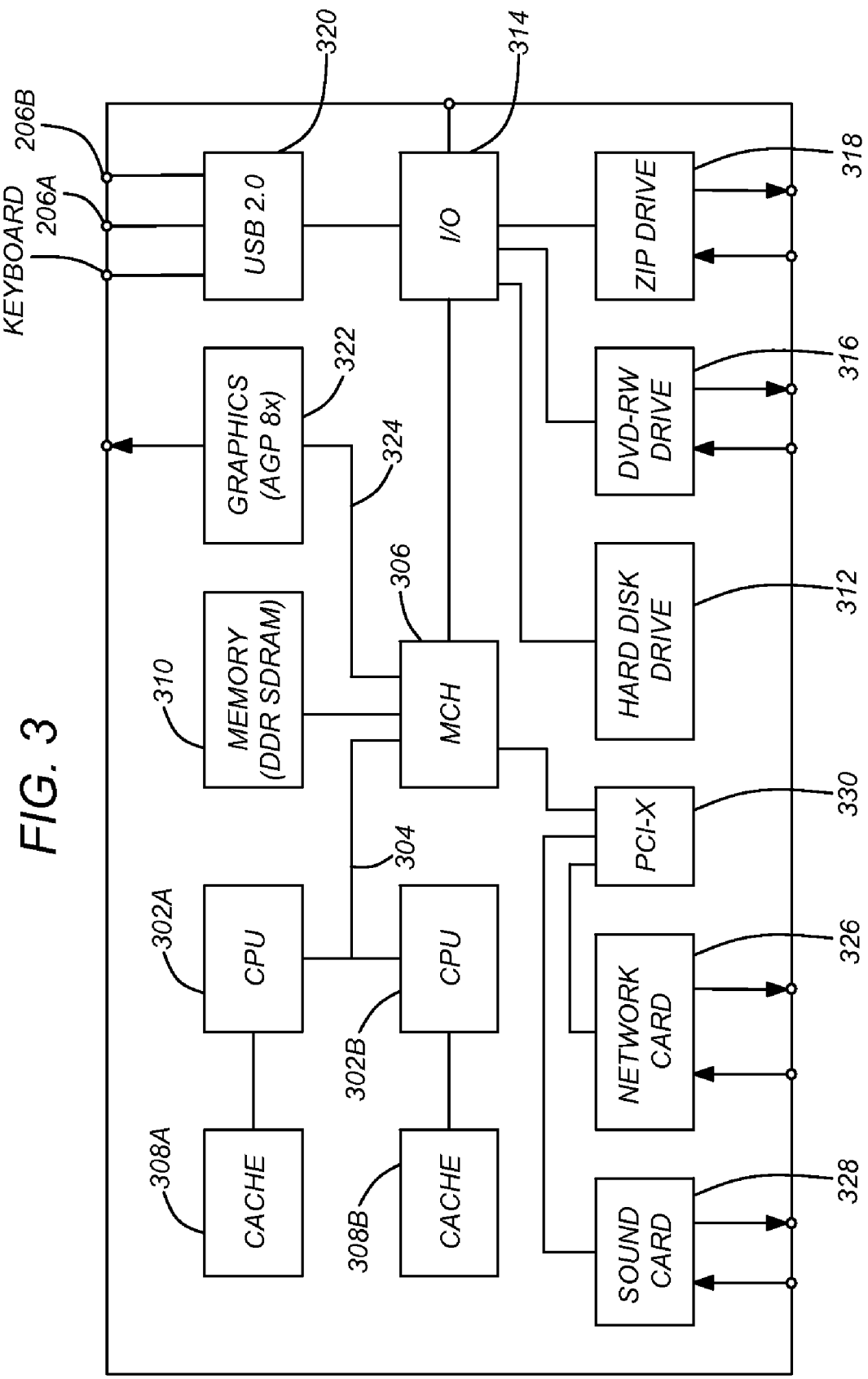
FIG. 3 illustrates the components of a computer system in accordance with one or more embodiments of the invention.

The components of computer system 200 are further detailed in FIG. 3 and, in the preferred embodiment of the present invention, said components are based upon the Intel® E7505 hub-based chipset.

The system 200 includes two Intel® Pentium™ Xeon™ DP central processing units (CPU) 302A, 302B running at three Gigahertz, that fetch and execute instructions and manipulate data via a system bus 304 providing connectivity with a Memory Controller Hub (MCH) 306. CPUs 302A, 302B are configured with respective high-speed caches 308A, 308B comprising at least five hundred and twelve kilobytes, which store frequently-accessed instructions and data to reduce fetching operations from a larger memory 310 via MCH 306. The MCH 306 thus co-ordinates data flow with a larger, dual-channel double-data rate main memory 310, that is between two and four gigabytes in data storage capacity and stores executable programs which, along with data, are received via said bus 304 from a hard disk drive 312 providing non-volatile bulk storage of instructions and data via an Input/Output Controller Hub (ICH) 314. The I/O hub 314 similarly provides connectivity to DVD-ROM read-writer 316 and ZIP™ drive 318, both of which read and write data and instructions from and to removable data storage media. Finally, I/O hub 314 provides connectivity to USB 3.0 input/output sockets 320, to which the stylus and tablet 206B combination, keyboard, and mouse 206A are connected, all of which send user input data to system 200.

A graphics card 322 receives graphics data from CPUs 302A, 302B along with graphics instructions via MCH 306. The graphics card 322 may be coupled to the MCH 306 through a direct port 324, such as the direct-attached advanced graphics port 8X (AGP 8X) promulgated by the Intel® Corporation, the bandwidth of which exceeds the bandwidth of bus 304. The graphics card 322 may also include substantial dedicated graphical processing capabilities, so that the CPUs 302A, 302B are not burdened with computationally intensive tasks for which they are not optimized.

Network card 326 provides connectivity to a framestore by processing a plurality of communication protocols, for instance a communication protocol suitable to encode and send and/or receive and decode packets of data over a Gigabit-Ethernet local area network. A sound card 328 is provided which receives sound data from the CPUs 302A, 302B along with sound processing instructions, in a manner similar to graphics card 322. The sound card 328 may also include substantial dedicated digital sound processing capabilities, so that the CPUs 302A, 302B are not burdened with computationally intensive tasks for which they are not optimized. Network card 326 and sound card 328 may exchange data with CPUs 302A, 302B over system bus 304 by means of Intel®'s PCI-X controller hub 330 administered by MCH 306.

Those skilled in the art will recognize that the exemplary environment illustrated in FIGS. 2 and 3 are not intended to limit the present invention. Indeed, those skilled in the art will recognize that other alternative environments may be used without departing from the scope of the present invention.

Software Environment

As described above, a software application 208 such as a computer-aided design application, a computer drawing program, or a building systems application may execute on computer 200. As used herein, the software application 208 will be referred to as the building systems application (BSA) 208. Such a BSA 208 may be a two-dimensional (2D) or three-dimensional (3D) application used for designing plumbing systems or other systems. As used herein, embodiments of the invention are not intended to be limited to plumbing/piping applications but may be used in any type of system where a property is applied to a selected run/length based on user-defined attributes. For example, embodiments may be utilized to define/modify a slope in a plumbing system, sprinkler system, air conditioning system, any piping system, rain gutter, tunnel, scaffolding, road, embankment, grading, hillside, etc. Similarly, embodiments may be used to define, model, or simulate sedimentary deposits along a shoreline (e.g., that decrease based on distance from a source), river, aqueduct, or lava flow, etc.

Software application 208 provides (or has a plug-in or can be provided with) the capability/ability to present a user-interface based tool for modifying a slope for an interconnected series of objects. The initial steps in either a 2D or 3D type environment involve activating the tool and selecting the pipe run or interconnected series of objects that the user desires to modify. Such a tool invocation may arise by selecting a particular interconnected series of objects and activating the right mouse button and/or selecting a tool option from a menu (e.g., a context menu). While the user may be required to select an interconnected series of objects prior to activating a tool in some embodiments, other embodiments may provide for activating the tool before selecting the objects (i.e., in which case the tool may prompt the user to select the objects).

The selection of the interconnected objects may be performed in a variety of manners. For example, the user may click one object (referred to as an anchor object), depress a keyboard key (e.g., the CTRL key) and the system may automatically select everything in a predefined series of objects (e.g., a pipe run). Alternatively, the user may select multiple anchor points and the selected run will comprise all objects in between the anchor points.

Figure 4:
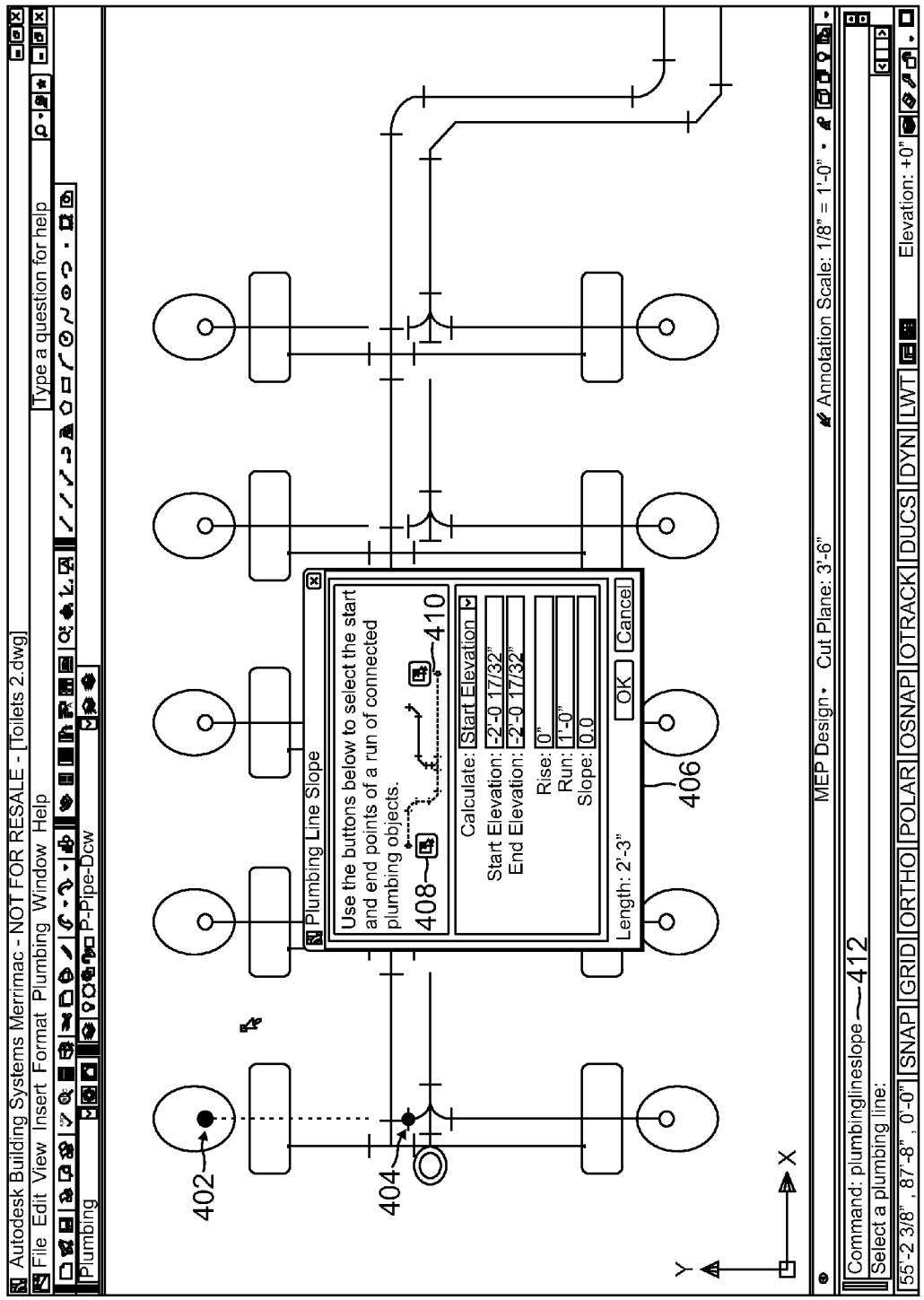
FIG. 4 illustrates an embodiment where the user selects a start point and an endpoint in accordance with one or more embodiments of the invention.

FIG. 4 illustrates an embodiment where the user selects a start point 402 and an endpoint 404. Once endpoints are selected, an indicator may be displayed. Such indicators may appear as highlighting of the identified endpoint/anchor point objects such that endpoints/anchor points are differentiated from the remaining objects on the screen. For example, the endpoints/anchors 402 and 404 may be displayed in different colors (e.g., green for a start point and red for an endpoint) or a glyph may be displayed at the anchor locations 402 and 404. Alternatively, different glyphs may be displayed to indicate the type of object/point.

Figure 5:
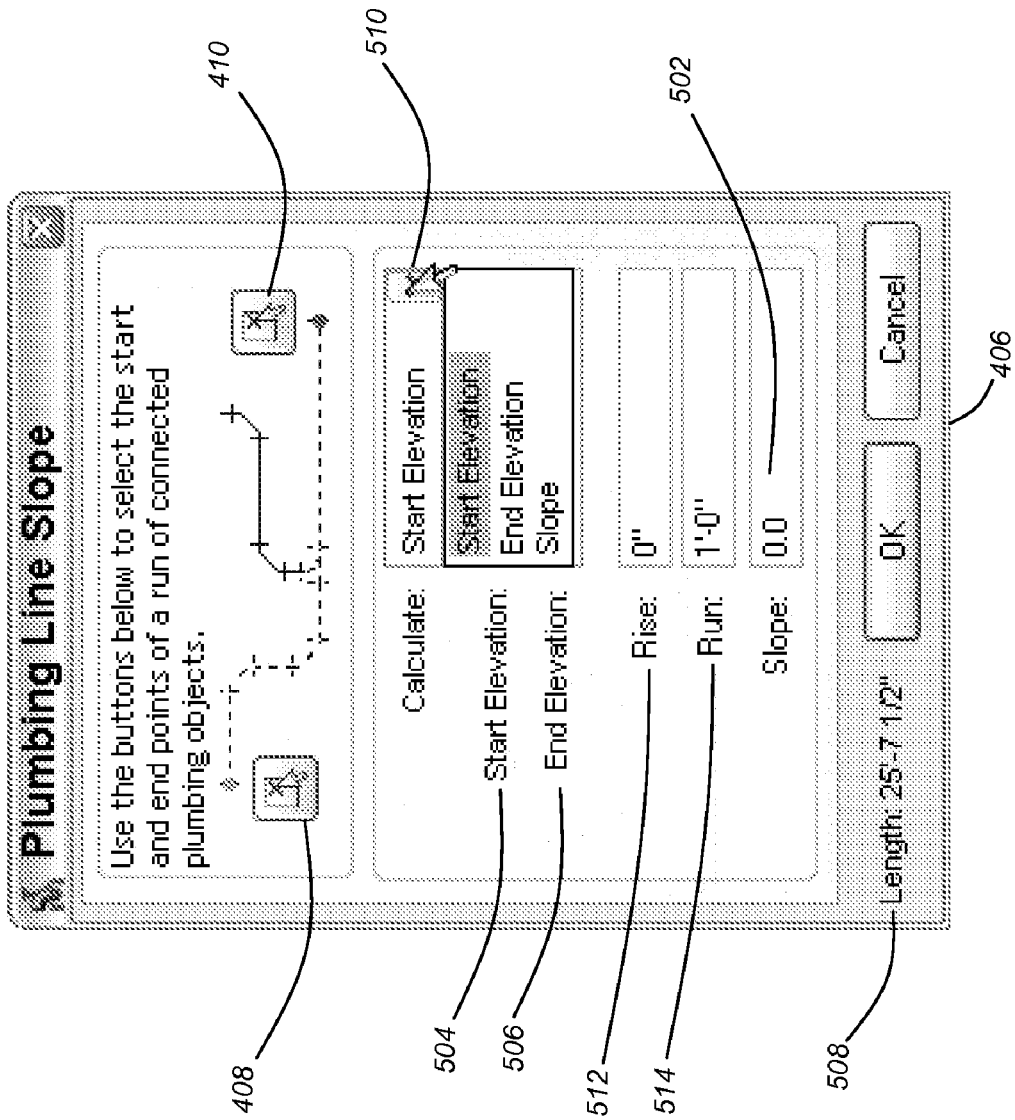
FIG. 5 illustrates a dialog box displayed in accordance with one or more embodiments of the invention.

Further, when selecting start and end points 402 and 404, a dialog box 406 may also be displayed. FIG. 5 illustrates the dialog box displayed in accordance with one or more embodiments of the invention. Buttons 408 and 410 within dialog box 406 may allow the user to redefine the start point and the endpoint of the selected run in which the user desires to define the slope and elevations. Such a dialog box 406 may be initially displayed with the slope information 502 of the original selected object segment populated. Further, the start and end elevations 504 and 506 of the object run may also be populated based on the properties of the selected object. In addition, the length 508 of the selected object may be displayed for information.

Within the dialog box 406, the user may hover over the buttons 408 and 410 to be informed (e.g., via a tooltip) that the user can select a start point or end point. Further, embodiments of the invention may only provide visual feedback (e.g., in the form of tooltips) regarding the ability to select certain points as the start and/or end points. For example, when hovering around certain objects, a node snap may appear at certain points. Similarly, objects available for selection as either a start or end point may be highlighted to assist the user during the selection process. In this regard, if the user attempts to select an end point (or a start point) on a non-highlighted object, the tool may provide visual feedback (e.g., in the command line 412 or via an dialog box) to select an endpoint (or a start point) on a highlighted object.

Once the start and endpoints have been selected, all of the objects interconnected between the two points (e.g., all of the plumbing objects that are connected to the originally selected objects) may be highlighted. The user may also use the buttons 408 and 410 to select new start and/or end points as desired. When/if new start/end points are selected, the respective points are reset and only the objects connected between the new start and/or end point are highlighted to indicate that they are part of the selection of objects for which the slope and elevation calculation will be applied. In addition, objects in the drawing may be highlighted to indicate availability for selection as start/end points. If a non-highlighted object is selected, an error message with a prompt to select a start/end point on a highlighted object may be displayed. Further, various fields such as the start and end elevations 504 and 506, as well as the slope 502 and length value 508 may be updated to reflected the updated/new selections. As set forth herein, the slope 502 is based on the rise over run calculation such that the slope is defined as a percentage in accordance with:

$$\text{Slope}(\%) = \arctan(Z) \text{ in Grads, where } Z = \text{Rise}/\text{Run}$$

Accordingly, the rise and run fields may be updated based on the selection. If the slope of all of the selected objects in the run varies, the rise and slope values may reflect such variance by displaying the term "VARIES" in the respective fields.

Once the desired run of objects has been selected, the user may then opt to adjust the slope of the run. There are various different mechanisms that may be used to calculate the slope. As illustrated in list box 510 of FIG. 5, the user may opt to calculate the start elevation, the end elevation, or the slope. If the user opts to calculate the start elevation, the start elevation field 504 is disabled and the value of the start elevation field 504 will update based on the values in the end elevation 506 and slope fields 502.

If the user opts to calculate the end elevation, the end elevation field 506 is disabled and the value in the end elevation field 506 updates based on the values in the start elevation field 504 and slope fields 502.

If the user opts to calculate the slope, the rise 512, run 514, and slope fields 502 will be disabled and the values in those fields 502, 512, and 514 will update based on the values in the start elevation 504 and end elevation fields 506.

When a slope is adjusted, connecting objects in the line may also be updated. For example, the elevation of a connected plumbing segment may be updated to be at the same elevation of an updated plumbing run. Further, the slope of a run (e.g., a plumbing line) may be recalculated for the branch lines to remain connected to the run and the fixture.

EXAMPLE

Figure 6:
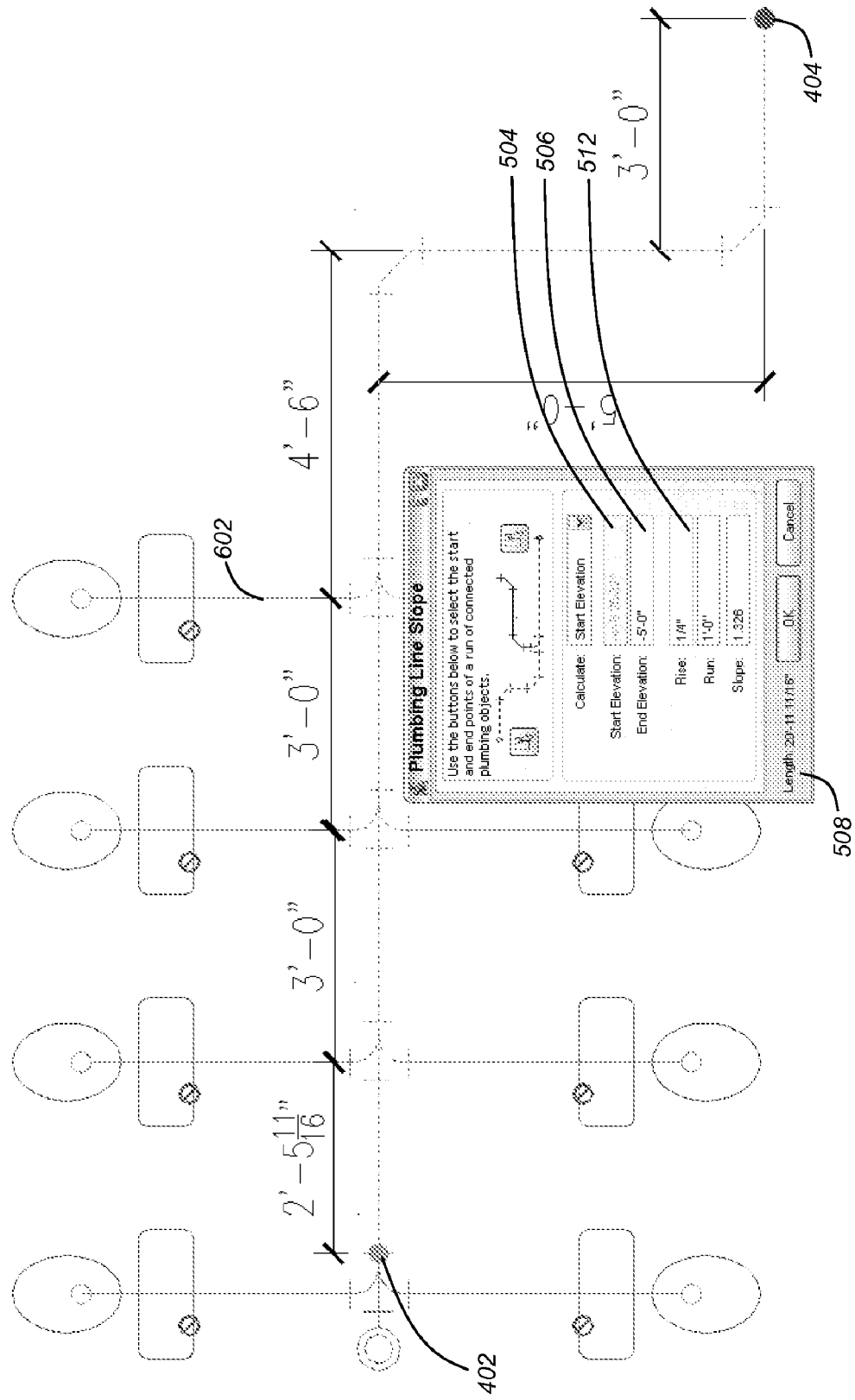
FIG. 6 illustrates an example of adjusting the slope of a plumbing line in accordance with one or more embodiments of the invention.

FIG. 6 illustrates an example of adjusting the slope of a plumbing line in accordance with one or more embodiments of the invention. To begin the line slope adjustment activity, the user may select a menu option, right click on a particular run/line, type a keyboard shortcut, or use any other known technique for initiating action.

The user selects/identifies the start 402 and end points 404 as described above. Once the points 402 and 404 have been identified, the system automatically (e.g., without additional user input) selects the plumbing line and objects. As indicated in FIG. 6, the plumbing line is highlighted (indicated by a dashed/dotted line) to indicate the line/run that is being adjusted. As an alternative to selecting/identifying start/end points, a run/line may already be pre-configured/selected/identified (e.g., in a 3D system) by the system or by the user. In such a system, the user can merely select a particular line. The user may also manually identify each component of a plumbing line (e.g., by holding down a shift/ctrl key and selecting [e.g., using a mouse and cursor] each part of the desired line and/or objects). Once a line has been identified the length field 508 is updated to reflect the sum of the linear dimensions as annotated in FIG. 6.

Since the user has elected to calculate the start elevation, the starting elevation field 504 is dimmed. The user enters in −5' for the end elevation value 506 and 0.25" for the rise value 512. Once the length has been determined, and the end elevation 506 and rise 512 are entered, the slope is automatically (i.e., without additional user input) calculated as 1.326. The system will further determine the elevation properties of the connected plumbing lines based on the start and end elevations and a continuous slope. In this regard, the slope property for all of the plumbing line segments will set to ¼" per 1' (i.e., based on the user's input). In addition, the slop of connected branch lines (e.g., branch line 602) is recalculated to maintain the elevation of the connected parts and fittings.

In various drawing programs, multiple views of a line may be available. In such programs, the slope of the line may be updated/adjusted in all views simultaneously (and dynamically) with (or without) additional user action.

Logical Flow

Figure 7:
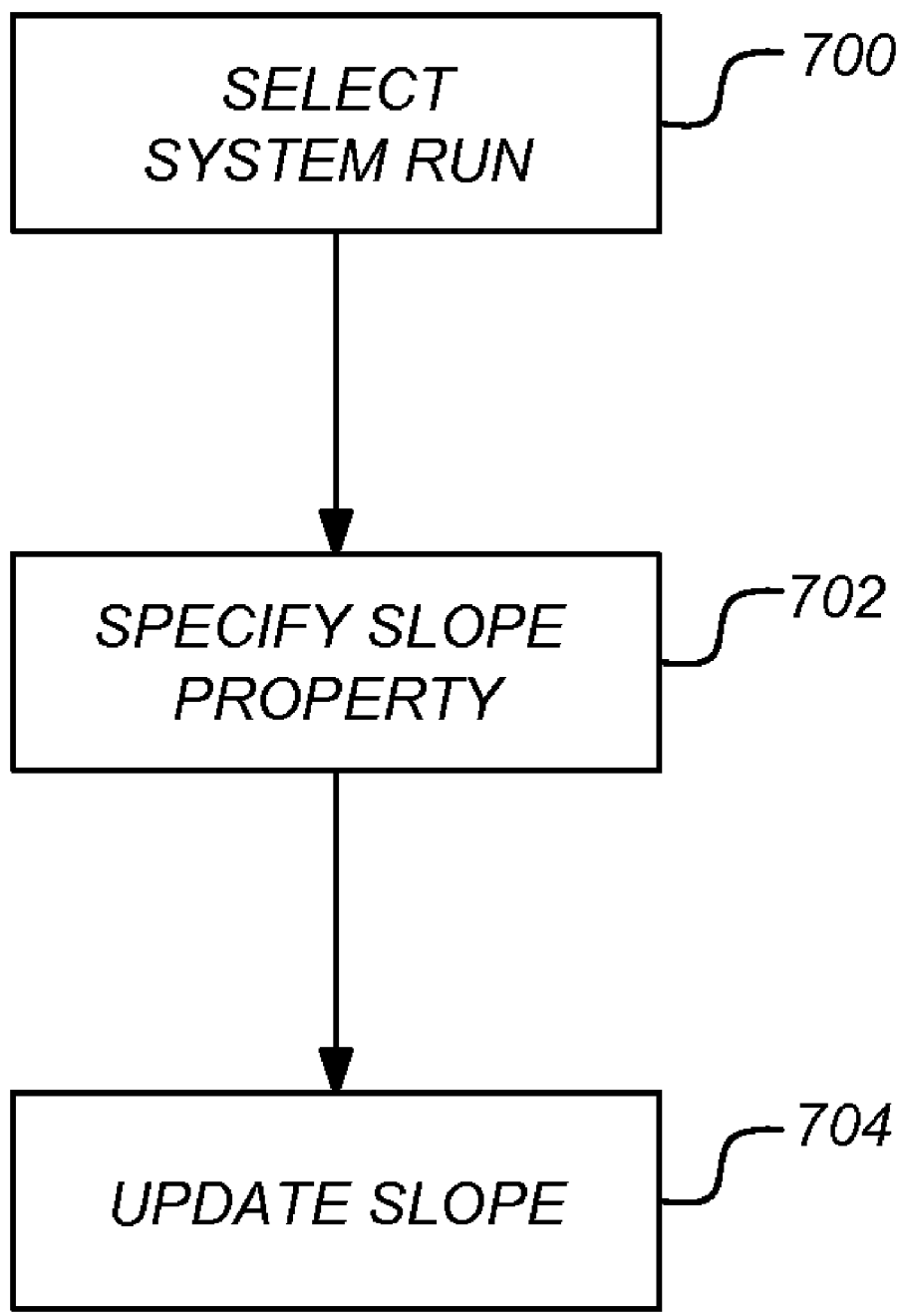
FIG. 7 is a flow chart illustrating the logical flow for updating a slope of a run in a system in a computer drawing application in accordance with one or more embodiments of the invention.

FIG. 7 is a flow chart illustrating the logical flow for updating a slope of a run in a system in a computer drawing application in accordance with one or more embodiments of the invention. At step 700, a system run (that is comprised of an interconnected series of objects) is selected. The interconnected series of objects are part of the same system (e.g., a plumbing system, an electrical system, a gas system, a hillside gradient, etc.) Further, the system run has a starting point and an ending point.

Such a system run can be selected in various ways. For example, a user can specify the start and end point. Once the endpoints have been identified, the user can further manually select the interconnecting objects between the start and end point (i.e., the run/length/path to be adjusted). Alternatively, the computer drawing application can automatically, dynamically, and without additional user input, select the interconnecting objects between the start and end point. In yet another embodiment, the user can select a pre-defined segment that contains the start point, end point, and interconnected objects in between (e.g., in a 3D system where segments are pre-defined or defined prior to the use of the slope modification tool). The system run is also selected from a pre-existing drawing. In other words, the system run has already been created and the user is now elected to edit the slope of such a run. In this regard, embodiments of the invention may be directed towards editing an existing run and not the initial creation of a run.

At step 702, a property for the slope of the system run is specified. Such a property may include the starting point, the ending point, the rise, the run, or the actual slope. The slope may be defined in terms of the arctan (Z) in gradients where Z=rise/run.

At step 704, the slope of the system run is updated across all of the interconnected series of objects based on the specified property. Thus, rather than adjusting one single object, the slope for the entire run is updated to reflect the changed property value. Such updating may calculate the start elevation of the starting point based on an end elevation of the ending point and the slope (which may also include the length of the run). Alternatively, the end elevation of the ending point may be calculated based on the start elevation of the starting point and the slope (and length of the run). In yet another embodiment, the rise/run may be specified.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide the ability to update the slope of a run/length in a computer drawing application. Such a drawing application may be a 3D drawing application or a 2D drawing application. In either 2D or 3D, the slope of an entire run may be interactively updated merely by the user updating/modifying simple properties of the slope. Thus, embodiments of the invention provide an easy mechanism for specifying a slope for a particular system run and easily updating the slope for the entire run.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for updating a slope of a run in a system in a computer drawing application, comprising:
 (a) displaying, in the computer drawing application, three or more objects;
 (b) displaying, in the computer drawing application, a visual indicator indicating which of the three or more objects can be selected as a starting point or an ending point;
 (c) selecting, in the computer drawing application, a system run comprised of an interconnected series of the three or more objects, wherein:
  (i) the interconnected series of objects are part of the same system;
  (ii) the system run comprises the starting point, the ending point, and all points in between the starting point and the ending point;
  (iii) the starting point and the ending point are selected by a user via a dialog box; and
  (iv) the computer drawing application provides an option to either:
   (1) automatically select, without additional user input, all points in between the selected starting point and the selected ending point; or
   (2) manually select each of the three or more objects in the system run;
 (d) specifying, using the dialog box, a property for a slope of the system run; and
 (e) automatically updating, without additional user input, the slope of the system run across all of the interconnected series of objects in the system run based on the specified property, by automatically, without additional user input, updating an elevation of one or more of the three or more objects to reflect the slope across the entire system run consistent with the specified property wherein the updating is performed without disconnecting the series of three or more objects.

2. The method of claim 1, wherein the system run is selected by:
 the user specifying the starting point;
 the user specifying the ending point; and
 the computer drawing application automatically and without additional user input selecting interconnecting objects between the starting point and the ending point.

3. The method of claim 1, wherein the system run is selected by:
 the user specifying the starting point;
 the user specifying the ending point; and
 the user selecting the interconnecting objects between the starting point and the ending point.

4. The method of claim 1, wherein the updating comprises calculating a start elevation of the starting point based on an end elevation of the ending point and the slope.

5. The method of claim 1, wherein the updating comprises calculating an end elevation of the ending point based on a start elevation of the starting point and the slope.

6. The method of claim 1, wherein the updating comprises calculating the slope based on a starting elevation of the starting point and an end elevation of the ending point.

7. The method of claim 1, wherein the property for the slope of the system run comprises a rise property or a run property.

8. The method of claim 1, wherein the property for the slope=arctan (Z) in Grads, where Z=Rise/Run.

9. The method of claim 1, wherein the three or more objects in the system run are highlighted to indicate the selecting.

10. An apparatus for updating a slope of a run in a system in computer drawing application comprising:
   (a) a computer having a memory;
   (b) a computer drawing application executing on the computer, wherein the computer drawing application is configured to
      (i) display, on a display device communicatively coupled to the computer, three or more objects;
      (ii) display, on the display device, a visual indicator indicating which of the three or more objects can be selected as a starting point or an ending point;
      (iii) select a system run comprised of an interconnected series of the three or more objects, wherein:
         (1) the interconnected series of objects are part of the same system;
         (2) the system run comprises the starting point, the ending point, and all points in between the starting point and the ending point;
         (3) the starting point and the ending point are selected by a user via a dialog box; and
         (4) the computer drawing application provides an option to either:
            (A) automatically select, without additional user input, all points in between the selected starting point and the selected ending point; or
            (2) manually select each of the three or more objects in the system run;
      (iv) specify, using the dialog box, a property for a slope of the system run; and
      (v) automatically update, without additional user input, the slope of the system run across all of the interconnected series of objects in the system run based on the specified property, by automatically, without additional user input, updating an elevation of one or more of the three or more objects to reflect the slope across the entire system run consistent with the specified property wherein the updating is performed without disconnecting the series of three or more objects.

11. The apparatus of claim 10, wherein the system run is selected by:
   the user specifying the starting point;
   the user specifying the ending point; and
   the computer drawing application automatically and without additional user input selecting interconnecting objects between the starting point and the ending point.

12. The apparatus of claim 10, wherein the system run is selected by:
   the user specifying the starting point;
   the user specifying the ending point; and
   the user selecting the interconnecting objects between the starting point and the ending point.

13. The apparatus of claim 10, wherein the computer drawing application is configured to update by calculating a start elevation of the starting point based on an end elevation of the ending point and the slope.

14. The apparatus of claim 10, wherein the computer drawing application is configured to update by calculating an end elevation of the ending point based on a start elevation of the starting point and the slope.

15. The apparatus of claim 10, wherein the computer drawing application is configured to update by calculating the slope based on a starting elevation of the starting point and an end elevation of the ending point.

16. The apparatus of claim 10, wherein the property for the slope of the system run comprises a rise property or a run property.

17. The apparatus of claim 10, wherein the property for the slope=arctan (Z) in Grads, where Z=Rise/Run.

18. The apparatus of claim 10, wherein the three or more objects in the system run are highlighted to indicate the selecting.

19. An article of manufacture comprising a program storage medium readable by a computer and embodying one or more instructions executable by the computer to perform a method for updating a slope of a run in a system in a computer drawing application, comprising:
   (a) displaying, in the computer drawing application, three or more objects;
   (b) displaying, in the computer drawing application, a visual indicator indicating which of the three or more objects can be selected as a starting point or an ending point;
   (c) selecting, in the computer drawing application, a system run comprised of an interconnected series of three or more objects, wherein:
      (i) the interconnected series of objects are part of the same system;
      (ii) the system run comprises the starting point, the ending point, and all points in between the starting point and the ending point;
      (iii) the starting point and the ending point are selected by a user via a dialog box; and
      (iv) the computer drawing application provides an option to either:
         (1) automatically select, without additional user input, all points in between the selected starting point and the selected ending point; or
         (2) manually select each of the three or more objects in the system run;
   (b) specifying, using the dialog box, a property for a slope of the system run; and
   (c) automatically updating, without additional user input, the slope of the system run across all of the interconnected series of objects in the system run, based on the specified property, by automatically, without additional user input, updating an elevation of one or more of the three or more objects to reflect the slope across the entire system run consistent with the specified property wherein the updating is performed without disconnecting the series of three or more objects.

20. The article of manufacture of claim 19, wherein the system run is selected by:
   the user specifying the starting point;
   the user specifying the ending point; and
   the computer drawing application automatically and without additional user input selecting interconnecting objects between the starting point and the ending point.

21. The article of manufacture of claim 19, wherein the system run is selected by:
   the user specifying the starting point;
   the user specifying the ending point; and
   the user selecting the interconnecting objects between the starting point and the ending point.

22. The article of manufacture of claim 19, wherein the updating comprises calculating a start elevation of the starting point based on an end elevation of the ending point and the slope.

23. The article of manufacture of claim 19, wherein the updating comprises calculating an end elevation of the ending point based on a start elevation of the starting point and the slope.

24. The article of manufacture of claim 19, wherein the updating comprises calculating the slope based on a starting elevation of the starting point and an end elevation of the ending point.

25. The article of manufacture of claim 19, wherein the property for the slope of the system run comprises a rise property or a run property.

26. The article of manufacture of claim 19, wherein the property for the slope=arctan (Z) in Grads, where Z=Rise/Run.

27. The article of manufacture of claim 19, wherein the three or more objects in the system run are highlighted to indicate the selecting.

* * * * *